United States Patent

Obuchi et al.

[11] Patent Number: 5,578,868
[45] Date of Patent: Nov. 26, 1996

[54] IC MEMORY CARD

[75] Inventors: Jun Obuchi, Itami; Hiroshi Miura; Tomomi Morii, both of Sanda; Shigeo Onoda, Itami, all of Japan

[73] Assignee: Mitsubishi Denki Kabushiki Kaisha, Tokyo, Japan

[21] Appl. No.: 449,431

[22] Filed: May 24, 1995

[30] Foreign Application Priority Data

May 31, 1994 [JP] Japan .................................. 6-119042

[51] Int. Cl.⁶ .................................................. H01L 23/02
[52] U.S. Cl. ............................................. 257/679; 257/678
[58] Field of Search .................................. 361/737, 752, 361/796; 257/679, 787, 678

[56] References Cited

U.S. PATENT DOCUMENTS 4,532,419  7/1985  Takeda .................................... 257/679
5,335,145  8/1994  Kusui ...................................... 361/737
5,477,426  12/1995 Bethurum ............................... 361/737
5,493,477  2/1996  Hirai ....................................... 257/679

Primary Examiner—Sara W. Crane
Assistant Examiner—S. V. Clark
Attorney, Agent, or Firm—Leydig, Voit & Mayer

[57] ABSTRACT

An IC memory card has a connector that cannot warp during the manufacturing process even if the connector is long, such as a connector at one longer side of the IC memory card with an increased number of poles. The IC memory card has grooves in the surfaces of a flange portion of the connector body opposing a surface with which the connection with an external unit is established, the grooves being adjacent the connector body and extending lengthwise along all of the longer side of the IC memory card for preventing warping.

5 Claims, 5 Drawing Sheets

B > C

IC MEMORY CARD

BACKGROUND OF THE INVENTION

1. Field of the Invention

This invention relates to an IC memory card including electronic elements.

2. Description of the Related Art

FIG. 10 is a perspective view showing a conventional IC memory card. FIG. 11 is cross-sectional view showing the conventional IC memory card shown in FIG. 10 and taken along line 11—11 of FIG. 10. As shown in FIG. 11, the IC memory card comprises a U-shaped frame 3 made of resin or the like, a connector 6 mounted on the open end of the U-shape frame 3 to form a rectangular frame, and two substantially rectangular panels 4 bonded to the upper and lower sides of the frame 3 and the connector 6. Each of the panels 4 is bonded at its outer edge to the inside surface to the frame 3 by an adhesive agent 5. The IC memory card 7 includes a circuit board 2 supported by the frame 3 and the connector 6 and having electronic elements 1 disposed thereon. The connector 6 is, as shown in FIG. 10, disposed on either of the shorter sides of the IC memory card 7. The connector 6 has tens of socket contacts 8 per line, the socket contacts 8 being disposed in two lines. Each of the socket contacts 8 includes a hole perpendicular to an external-unit connection surface 20 of the connector 6. Each socket contact 8 includes a terminal 9 electrically connected to an electronic element mounted on the IC memory card 7.

FIG. 12 is a schematic and enlarged cross-sectional view of the connector 6 shown in FIG. 11. The connector 6 is made of resin or the like by a molding process. The connector 6 comprises a rectangular parallelepiped connector body 6b and flange portions 6a, the connector body 6b including the socket contacts 8 (see FIG. 10). The flange portions 6a are each adjacent to the connection portion of the connector body 6b for establishing a connection with an external unit, the flange portions 6a forming the outer surface of the IC memory card 7 in the connector portion and lying in the same plane as the main surfaces of the panels 4. The connector 6 has a symmetrical cross-section parallel to the main surfaces of the panels 4.

IC memory cards have a standard size (width L:54.0 mm×length D:85.6 mm and thickness T:3.3 mm) according to, for example, the guideline issued by the Japan Electronic Industry Association.

A connector (omitted from illustration) of an external unit, into which the IC memory card 7 is inserted, is composed of a connector surface having a substantially rectangular shape and a frame-shape connector guide located around the outer end of the connector surface. The connector surface has contact pins (omitted from illustration) which are terminals electrically connected to the internal system of the external unit, the contact pins having a configuration complementary to the socket contacts 8 disposed in the connector 6 of the IC memory card 7. The contact pins project and correspond to the socket contacts 8.

With the conventional IC memory card, the connector 6 disposed on the shorter side of the IC memory card 7 is inserted into the connector of an external unit (omitted from illustration) through an insertion port in the external unit (omitted from illustration) for receiving the IC memory card 7. The socket contacts 8 disposed in the connector 6 of the IC memory card 7 and the contact pins (omitted from illustration) disposed in the connector of the external unit correspond to one another and thus the electrical connection is established. As a result, the IC memory card 7 and the external unit are electrically connected to each other.

The conventional IC memory card usually has the connector 6 on either of the shorter sides of the IC memory card 7 as shown in FIG. 10. However, a suggestion has been made in, for example, Japanese Patent Application No. 6-46020, which is not a known technology, for an arrangement with the connector 6 on either of the longer sides of the IC memory card in order to increase the number of the poles of the connector yet maintain the standard size of the card. The IC memory card of the foregoing type comprises a connector that is longer than the connector 6 disposed on the shorter side of the IC memory card.

Ideally, the connector 6 has a cross-sectional shape that is axially symmetric about a plane parallel to the main surfaces of the panels 4. However, it is difficult to make the vertical flanges 6a the same size (height A and width B). Unavoidable dimensional errors and errors occurring during manufacturing cause a slight difference. If there is a slight difference between the sizes of the vertical flange portions, the connector 6 is warped so that the vertical flange portion having a larger cross-sectional area forms a concavity because the contraction is larger for the flange portion which has a larger cross-sectional area (see FIG. 13).

The warping of the connector 6 is substantially proportional to the length of the connector 6 so that lengthening of the connector 6 causes the warping to increase. If the connector 6 is warped excessively, the IC memory card 7 cannot easily be assembled. If the IC memory card 7 is forcibly assembled, distortion of the overall body of the IC memory card 7 takes place, causing problems when connection with an external unit is established. Therefore, warping is a critical problem with an IC memory card of the type comprising a connector 6 disposed on the longer side. The problem of excessive warping also arises with the connector 6 when the flange portion has a large volume because the amount of the contraction is increased.

In the conventional IC memory card arranged as shown in FIGS. 10 and 11, the panels 4 are bonded to the frame 3 by the adhesive agent 5 only at the periphery of the panels. The panels 4 are not supported by other portions. Therefore, if a vertical force acts on the main surface of the panel 4, the panel 4 will easily be deformed, particularly at the central portion. As a result, the panel 4 is undesirably pressed against the electronic element 1 mounted on the circuit substrate 2, and, therefore, the electronic elements 1 may be broken.

Heat generated due to electrical power dissipation of the electronic elements 1 when the IC memory card 7 is activated is discharged through two main routes. One of the two routes is from the surfaces of the electronic elements 1 to the ambient through air in the IC memory card 7 and the surfaces of the panels 4. In a residual route, heat is transmitted from the electronic elements 1 to the circuit substrate 2 through leads of the electronic elements 1 and then it is discharged from the surface of the circuit substrate 2 to the ambient through air in the IC memory card 7 and the surface of the panel 4. When the electronic elements 1 are operated actively, the electronic elements 1 generate a large amount of heat. If the temperature in the IC memory card 7 rises, the IC memory card 7 may operate erroneously or the bonded portion between the panels 4 and the frame 3 may become separated.

In a conventional system for establishing a connection between the IC memory card 7 and the external unit, the socket contacts 8 of the IC memory card 7 and the connect pins of the external unit are reliably brought into contact with one another by firmly inserting the connect pins of the external unit into the socket contacts 8. Therefore, the connect pins and the socket contacts 8 are joined firmly, thus causing difficulty in removing the IC memory card 7 from the external unit. When the IC memory card 7 is removed by hand, the hand may slip because the main surface of the panel 4 has no means that can be held by the fingers. Therefore, the IC memory card cannot be easily removed.

The foregoing problem becomes critical with an IC memory card of the type having a connector disposed on the longer side because the major portion of the IC memory card is inserted into the external unit and thus only a small area is available to be held by the hand when the IC memory card has been connected to the external unit. In this case, a large force is required to remove the IC memory card because a multiplicity of connector pins are provided.

SUMMARY OF THE INVENTION

The present invention has been made to overcome the foregoing problems and an object is to provide an IC memory card that does not warp even if the IC memory card is long.

Another object of the present invention is to provide an IC memory card having a panel that does not deform so that electronic elements mounted on a circuit substrate cannot be broken even if force is applied perpendicular to the main surface of the IC memory card.

Another object of the present invention is to provide an IC memory card that is excellent in discharging heat.

Another object of the present invention is to provide an IC memory card that can easily be removed from an external unit.

An IC memory card according to the present invention has grooves extending in the lengthwise direction of a connector, along the entire length of the longer side of the IC memory card, the grooves being formed in the corner portions opposing the external-unit-connection surface of the connector body.

An IC memory card according to the present invention has reinforcing members for reinforcing the panels and disposed on substantially the entire inner surfaces of the panels. The reinforcing members have supporting projections in contact with the circuit substrate.

An IC memory card according to the present invention has reinforcing members with openings between the electronic elements and the panels.

An IC memory card according to the present invention comprises metal plates disposed in the openings of the reinforcing members, the metal plates being located between the panels and the electronic elements.

An IC memory card according to the present invention comprises through holes at ends of the side opposing the side having the connector.

Since an IC memory card according to the invention has a cross-sectional area that is reduced by the grooves, the contraction is reduced and, therefore, warping of the connector can be prevented.

An IC memory card according to the invention has reinforcing members for supporting the panels, the reinforcing members being supported with respect to the circuit substrate by supporting projections. Therefore, the electronic elements are protected from external pressure.

In an IC memory card according to the invention, heat generated in the electronic elements is discharged to the outside through the openings.

In an IC memory card according to the invention, heat generated in the electronic elements can easily be transmitted to the outside through metal plates disposed in openings in the reinforcing members.

Since an IC memory card according to the invention has through holes that can be used when the IC memory card is removed from an external unit, the IC memory card can easily be removed from the external unit.

DESCRIPTION OF THE PREFERRED EMBODIMENTS

First Embodiment

Figure 1:
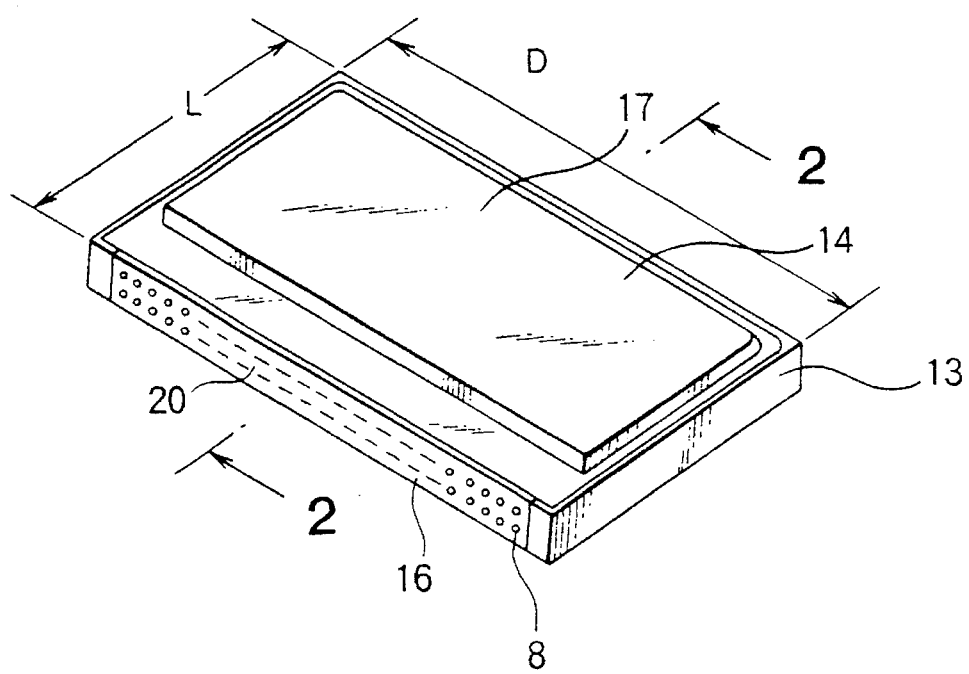
FIG. 1 is a perspective view of an IC memory card according to a first embodiment of the present invention.
Figure 2:
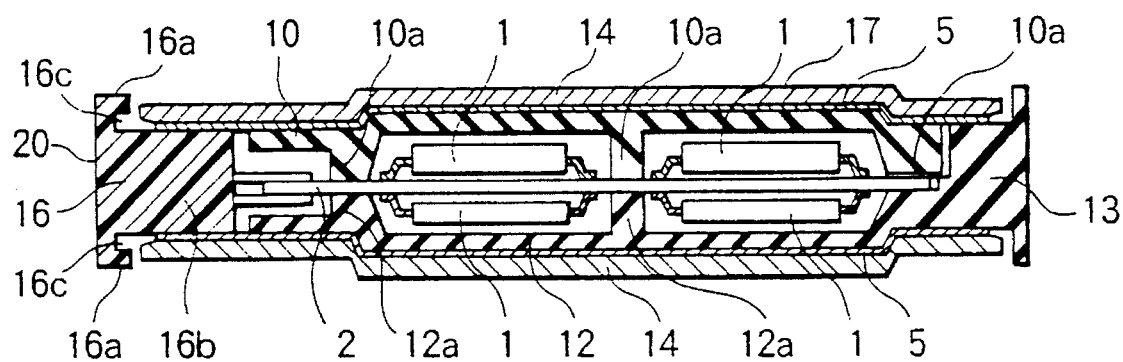
FIG. 2 is a cross-sectional view taken along line 2—2 shown in FIG. 1.

FIG. 1 is a perspective view showing an embodiment of an IC memory card according to the present invention. FIG. 2 is a cross-sectional view taken along line 2—2 of FIG. 1. The IC memory card 17 according to the present invention has a U-shaped frame 13 made of resin or the like. The U-shaped frame includes two shorter sides and one longer side. A circuit substrate 2 is supported by the frame 13, as is a connector 16, and electronic elements 1 and the like are mounted on the circuit substrate 2.

Figure 4:
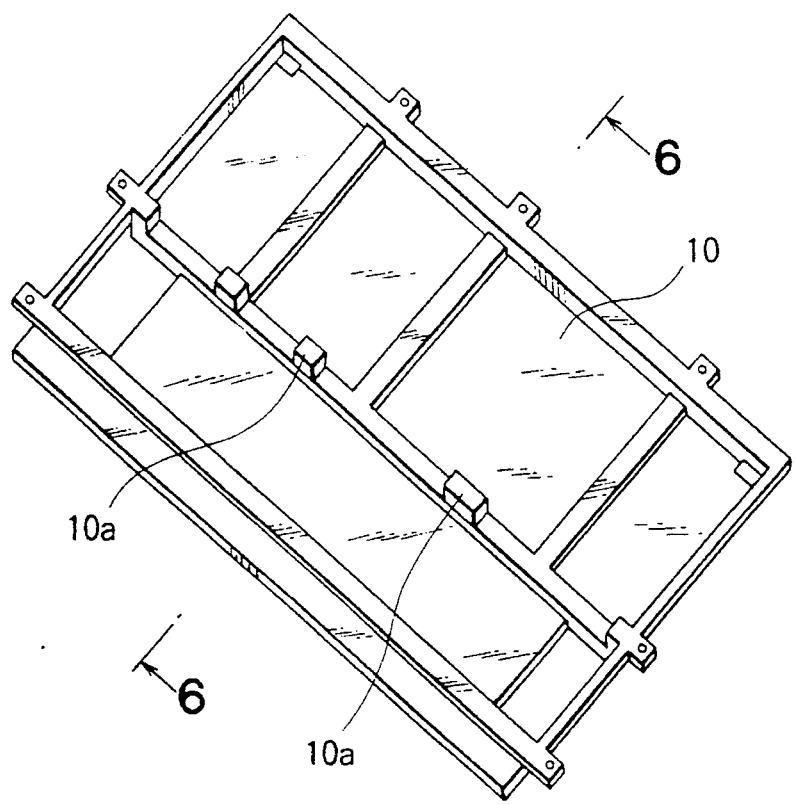
FIG. 4 is a perspective view of a first reinforcing member of an IC memory card according to the first embodiment of the present invention.

The circuit substrate 2 has, on either side, a first reinforcing member 10 made of resin or the like for protecting the electronic elements 1 on the circuit substrate 2. The first reinforcing member 10 has a rectangular shape having a size somewhat smaller than the size of the frame 13 with a rectangular tray shape outwardly projecting at the central portion. The first reinforcing member 10 has supporting projections 10a in contact with the circuit substrate 2 (see FIG. 4).

Figure 5:
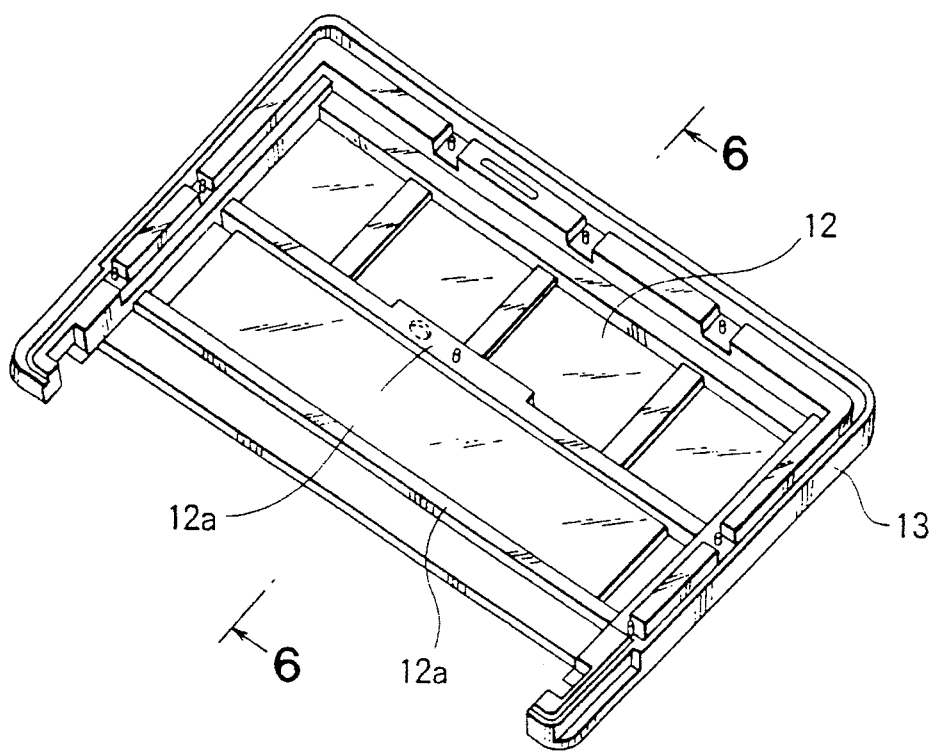
FIG. 5 is a perspective view of a second reinforcing member and a frame of an IC memory card according to the first embodiment of the present invention.
Figure 6:
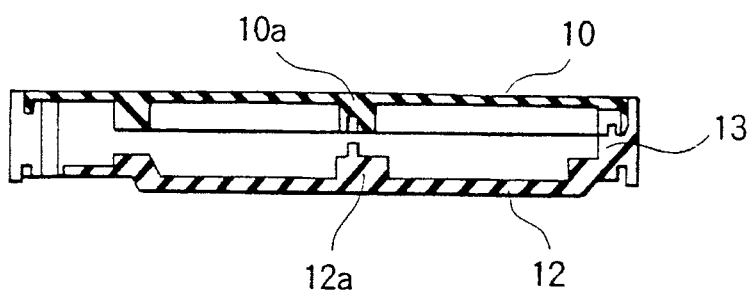
FIG. 6 is a cross-sectional view taken along line 6—6 shown in FIGS. 4 and 5.

Furthermore, a second reinforcing member 12 made of resin or the like for protecting the electronic elements 1 is mounted on the lower surface of the circuit substrate 2. The second reinforcing member 12 has a rectangular shape having a size somewhat smaller than the size of the frame 13 and is connected to the frame 13 at the outer surface as an integrated element. The second reinforcing member 12 is substantially symmetrical to the first reinforcing member 10 and has a rectangular tray shape projecting at the central portion. The second reinforcing member 12 has supporting projections 12a in contact with the circuit substrate 2 (see FIG. 5).

The first reinforcing member 10 has a panel 14 made by drawing to fit the projecting central portion of the first reinforcing member 10. The panel 14 is in close contact with the upper surface of the first reinforcing member 10, covering the first reinforcing member 10. The second reinforcing member 12 has, on its lower surface, a panel 14 disposed in the close contact.

Figure 3:
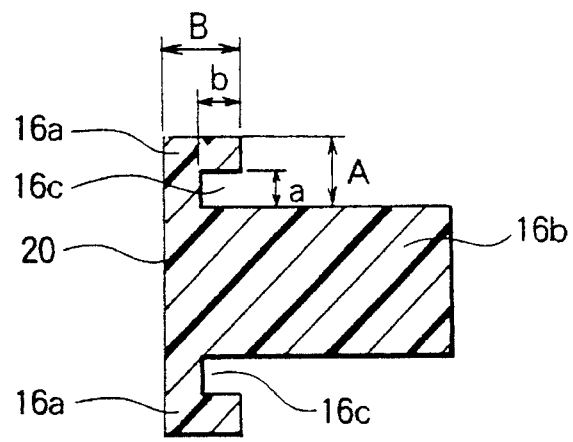
FIG. 3 is a schematic and enlarged cross-sectional view of a connector of an IC memory card according to the first embodiment of the present invention.

A connector 16 is disposed on the one of the four sides of the IC memory card 17 that is not occupied by the frame 13. The connector 16 is supported by portions of the two panels 14. FIG. 3 is a schematic, enlarged cross-sectional view of the connector 16 shown in FIG. 2. The connector 16 has a connector body 16b in the shape of a rectangular parallelepiped and a flange portion 16a disposed on the longer side of the IC memory card, which is a surface 20 of the connector body 16b for establishing connection with an external unit. Grooves 16c extending in the lengthwise direction of the connector 16 along substantially all the length of the longer side of the connector 16 are located at corner portions opposing the surface 20 of the connector 16 for establishing a connection with an external unit, the corners being connected to the connector body 16b. As a result, the cross-sectional area of the flange portion 16a can be reduced. In this embodiment, depth a of the groove 16c is half of the height A of the flange portion 16a, while width b of the groove 16c is half of the width B of the flange portion 16a.

The IC memory card 17 according to the present invention has an overall width L (shorter side) and a length D (longer side) that are substantially the standard size. As shown in FIG. 1, by disposing the connector 16 on either of the longer sides, the number of connector poles can be increased significantly.

The connector 16 has the grooves 16c so that the cross-sectional area of the flange portion 16a is reduced, thus reducing contraction after the molding process has been completed. As a result, warping of the connector 16 can be prevented. Thus, the IC memory card 17 can easily be formed by assembling the elements. In addition, distortion of the overall body of the IC memory card 17 can be prevented. The grooves 16c are covered by the panels 14 in the manufactured IC memory card 17. Therefore, the appearance of the IC memory card 17 is not unattractive as compared with an IC memory card that does not have the grooves 16c.

Since the grooves 16c are formed as described, breakage can occur in a portion from the end of the connector 16 to the grooves 16c if an external impact is applied to the connector 16. Therefore, the portions important for the functioning of the IC memory card 17, in which the socket contact 8 of the connector 16 is disposed, are protected from breakage.

Figure 10:
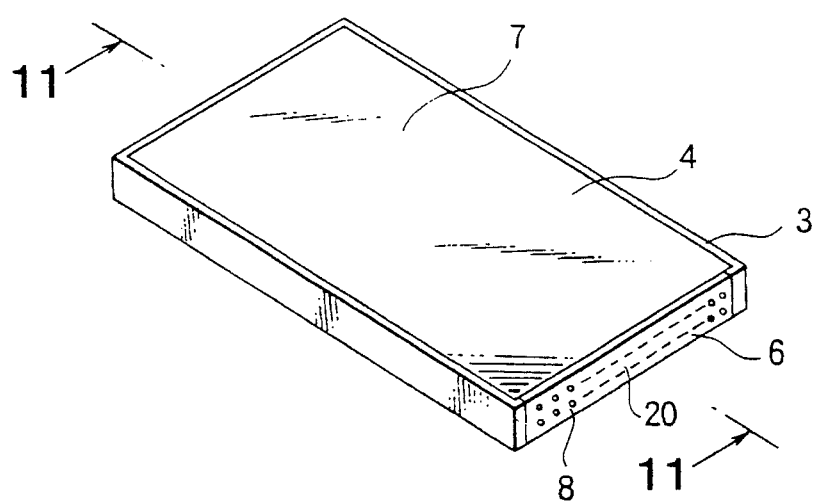
FIG. 10 is a perspective view of a conventional IC memory card.
Figure 11:
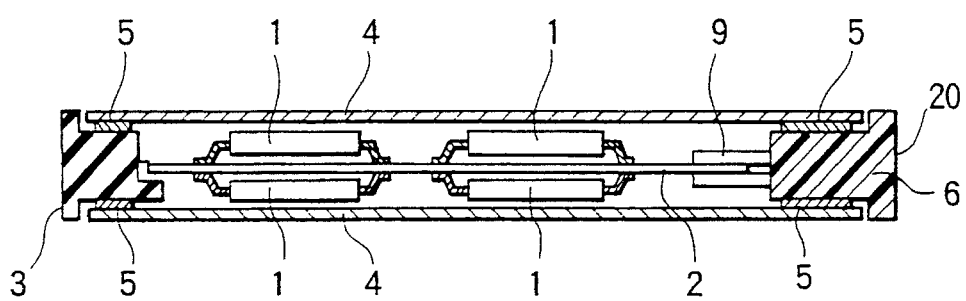
FIG. 11 is a cross-sectional view taken along line 11—11 shown in FIG. 10.
Figure 12:
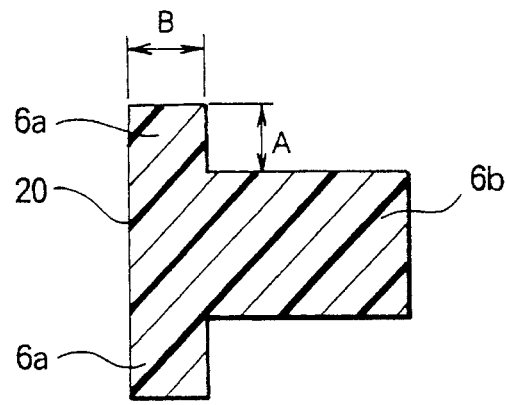
FIG. 12 is a schematic and enlarged cross-sectional view of a connector of a conventional IC memory card.
Figure 13:
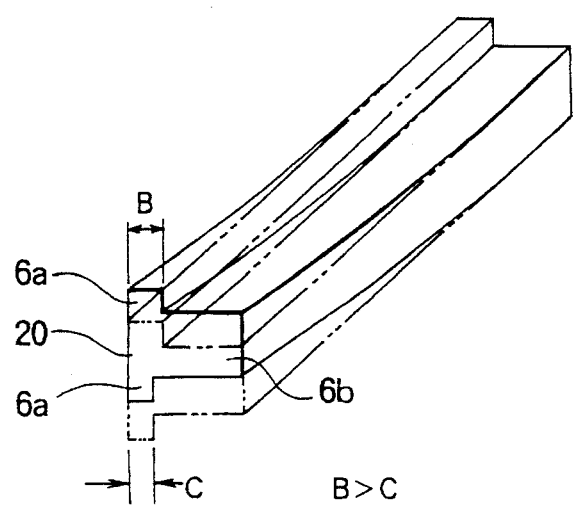
FIG. 13 is a perspective view showing a state where the connector of the conventional IC memory card is warped.

Since the two panels 14 of the IC memory card 17 are formed by drawing, the strength of the IC memory card 17 against twisting and bending is improved. Furthermore, the first reinforcing member 10 and the second reinforcing member 12 are brought into close contact with the entire surface on the inside of the panel 14 and are bonded by an adhesive agent 5. Thus, the bonding strength of the panel is improved significantly as compared with the conventional example shown in FIGS. 10 and 11 in which only the edges of the panels are bonded to the frame. Moreover, the strength of the IC memory card 17 against pressure is improved as compared with the conventional structure comprising only the panels.

Since the first reinforcing member 10 and the second reinforcing member 12 disposed on the entire inner surface of the panels 14 of the IC memory card 17 to reinforce the panels 14 have the supporting projections 10a and 12a in contact with the circuit substrate 2, the electronic elements 1 are protected from external pressure applied to the panels 14.

Where the electronic elements 1 on the circuit substrate 2 leave a place on the circuit substrate 2 where no electronic elements are present, a spacer has been required for the conventional IC memory card in place of the electronic elements 1 to support the panels 14. However, in the IC memory card 17 according to the present invention, the first reinforcing member 10 and the second reinforcing member 12 have the supporting projections 10a and 12a in contact with the circuit substrate 2 and no spacer is required.

Second Embodiment

Figure 7:
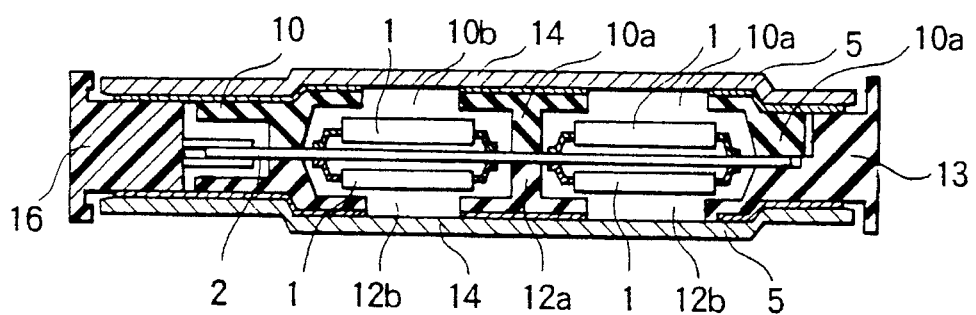
FIG. 7 is a cross-sectional view of an IC memory card according to a second embodiment of the present invention.

FIG. 7 is a cross-sectional view of an IC memory card according to a second embodiment of the present invention. The IC memory card 17 according to this embodiment comprises the first reinforcing member 10 having openings 10b between the electronic elements 1 and the panels 14. The second reinforcing member 12 has openings 12b similar to the openings 10b in the first reinforcing member 10.

In the IC memory card 17 according to the present invention, heat generated by the electronic elements 1 is directly transmitted to the panels 14 from the surfaces of the electronic elements 1 through air in the IC memory card 17. Because of the openings 10b and 12b of the first and second reinforcing members 10 and 12, the heat is then discharged to the ambient from the surfaces of the panels 14. Heat transmitted from the electronic elements 1 to the circuit substrate 2 through the leads of the electronic elements 1 is then transmitted from the surface of the circuit substrate 2 to the openings 10b and 12b through air in the IC memory card 17 and discharged to the ambient from the surfaces of the panels 14. Since the openings 10b and 12b are included in this embodiment, heat can be efficiently discharged to the ambient because the heat transmission is not hindered by the first and second reinforcing members 10 and 12.

Third Embodiment

Figure 8:
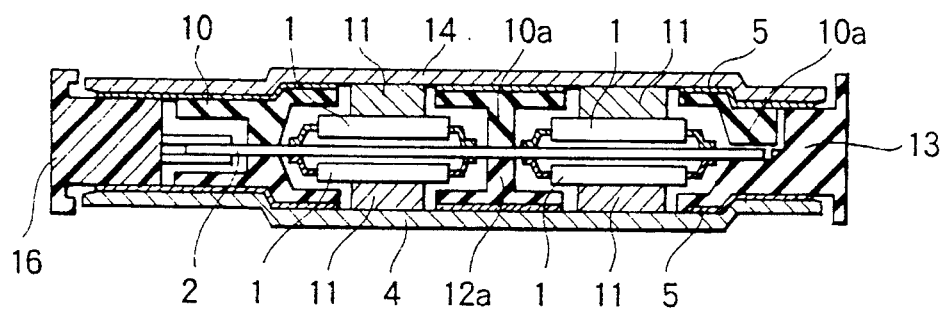
FIG. 8 is a cross-sectional view of an IC memory card according to a third embodiment of the present invention.

FIG. 8 is a cross-sectional view showing an IC memory card 17 according to a third embodiment of the present invention. The IC memory card 17 according to this embodiment comprises metal plates 11 disposed between the panels 14 and the electronic elements 1 in the opening 10b of the first reinforcing member 10 and the opening 12b of the second reinforcing member 12.

In the IC memory card 17 according to this embodiment, heat generated in the electronic elements 1 is transmitted from their surfaces to the panels 14 through the opening 10b and the metal plates 11, the heat being then discharged to the ambient from the surfaces of the panels 14. As a result, heat can be discharged to the ambient very efficiently.

Fourth Embodiment

Figure 9:
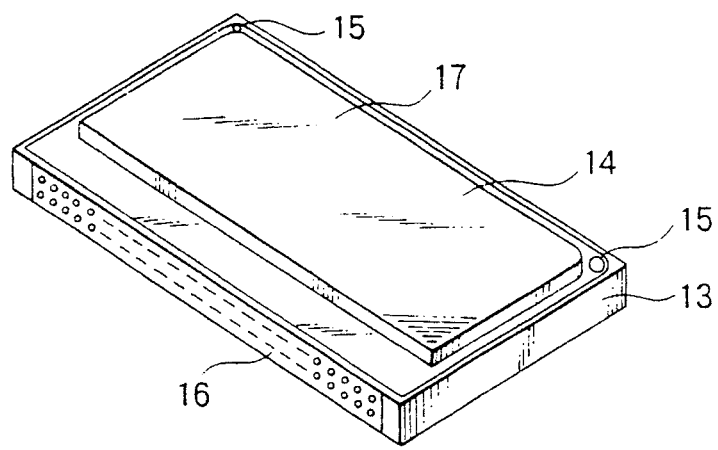
FIG. 9 is a perspective view of an IC memory card according to a fourth embodiment of the present invention.

FIG. 9 is a perspective view of an IC memory card according to a fourth embodiment of the present invention. The IC memory card 17 according to this embodiment, as shown in FIG. 9, comprises through holes 15 at two ends of a side opposing the side having the connector 16, the through holes 15 being disposed at two corners of a portion left exposed upon insertion of the IC memory card 17 into an external unit and, therefore, projecting outside of the external unit.

With the IC memory card 17 according to this embodiment, a string or a metal ring is passed through the through holes 15 so that the IC memory card 17 can easily be removed from the connector of an external unit by pulling on the string or ring. Since the through holes 15 are located at corners, the internal volume of the IC memory card 17 is not affected.

An IC memory card according to the present invention has grooves extending in the lengthwise direction of the connector along the entire length of the longer side of the IC memory card, the grooves being formed in the corner portions connected to the connector body. Therefore, the cross-sectional area of the flange portion can be reduced and warping of the connector is limited.

An IC memory card according to the present invention has reinforcing members for reinforcing the panels disposed on substantially the entire inner surfaces of the panels and including supporting projections in contact with the circuit substrate. Therefore, the panel will not be warped and the electronic elements are protected from pressure.

An IC memory card according to the present invention has reinforcing members with openings between the electronic elements and the panels. Therefore, heat generated in the electronic elements can be transmitted to the panels without being hindered by the reinforcing members and easily discharged to the outside.

An IC memory card according to the present invention comprises metal plates disposed in the openings of the reinforcing members, the metal plates being located between the panels and the electronic elements. Therefore, heat generated in the electronic elements can easily be discharged to the outside.

An IC memory card according to the present invention comprises through holes at ends of the side opposing the connector. Therefore, a string or the like passing through the holes can be pulled on to remove the IC memory card from the connector.

What is claimed is:

1. An IC memory card having a substantially rectangular shape with longer and shorter sides and comprising:

a connector at one side of said IC memory card, said connector comprising a connector body having a rectangular parallelepiped shape and a flange portion extending from a longer side of said connector body and including a surface for establishing connection with an external unit, said flange portion having grooves where said flange is connected to said connector body and opposing the surface, the grooves extending lengthwise along all of a longer side of said memory card.

2. An IC memory card comprising:

a frame;

a circuit board supported on said frame and having electronic elements mounted thereon;

a reinforcing member having a supporting projection centrally disposed on and protecting outwardly from said reinforcing member, said supporting projection contacting said circuit board; and a panel supported by said frame with an entire inner surface of said panel supported by said supporting projection.

3. An IC memory card comprising:

a frame;

a circuit board supported on said frame and having electronic elements mounted thereon;

a reinforcing member having a supporting projection in contact with said circuit board; and a panel supported by said frame with an entire inner surface of said panel supported by said supporting projection, said reinforcing member having an opening between said electronic elements and said panel.

4. The IC memory card according to claim 3 wherein a metal plate is disposed in the opening of said reinforcing member between said panel and said electronic elements.

5. An IC memory card having a substantially rectangular shape and comprising a connector along one side of said IC memory card and a through hole penetrating through said IC memory card at a side of said IC memory card opposite said connector for passage of an element for aiding extraction of said connector from an external unit.

\* \* \* \* \*